US010068876B2

(12) United States Patent
Kabe et al.

(10) Patent No.: US 10,068,876 B2
(45) Date of Patent: Sep. 4, 2018

(54) SEMICONDUCTOR DEVICE AND MANUFACTURING METHOD THEREFOR

(71) Applicant: Panasonic Intellectual Property Management Co., Ltd., Osaka (JP)

(72) Inventors: Tatsuya Kabe, Osaka (JP); Hideyuki Arai, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 59 days.

(21) Appl. No.: 15/062,115

(22) Filed: Mar. 6, 2016

(65) Prior Publication Data
US 2016/0190103 A1 Jun. 30, 2016

Related U.S. Application Data

(63) Continuation of application No. PCT/JP2014/004347, filed on Aug. 25, 2014.

(30) Foreign Application Priority Data

Sep. 20, 2013 (JP) ................. 2013-195378

(51) Int. Cl.
*H01L 25/065* (2006.01)
*H01L 23/00* (2006.01)
(Continued)

(52) U.S. Cl.
CPC ........ *H01L 25/0657* (2013.01); *H01L 23/528* (2013.01); *H01L 23/5329* (2013.01);
(Continued)

(58) Field of Classification Search
CPC ............. H01L 25/0657; H01L 23/5329; H01L 23/53295; H01L 21/76898; H01L 25/043;
(Continued)

(56) References Cited

U.S. PATENT DOCUMENTS 5,432,381 A 7/1995 Melzner
5,460,690 A 10/1995 Melzner
(Continued)

FOREIGN PATENT DOCUMENTS

JP 6-196569 7/1994
JP 2006-269519 10/2006
(Continued)

OTHER PUBLICATIONS

Writen Opinion PCT_JP2014000855 dated May 13, 2014.*
(Continued)

*Primary Examiner* — Yu Chen
*Assistant Examiner* — Pauline Vu
(74) *Attorney, Agent, or Firm* — McDermott Will & Emery LLP

(57) ABSTRACT

A semiconductor devise includes a first substrate and a second substrate which are bonded each other. A first substrate includes an insulating first surface film as an uppermost layer, a first electrode and an insulating second surface film respectively formed inside a plurality of openings in the first surface film, and a first seal ring. A second substrate includes an insulating third surface film as an uppermost layer, and a second electrode, an insulating fourth surface film respectively formed inside a plurality of openings in the third surface film, and a second seal ring. The first electrode and the second electrode are directly bonded together. The first surface film and the third surface film are directly bonded together. The second surface film and the fourth surface film are directly bonded together. A seal ring formed of the first seal ring, the second surface film, the fourth surface film, and the second seal ring is continuous between the first substrate and the second substrate.

11 Claims, 13 Drawing Sheets

(51) Int. Cl.
    *H01L 25/00*          (2006.01)
    *H01L 23/528*       (2006.01)
    *H01L 23/58*          (2006.01)
    *H01L 25/07*          (2006.01)
    *H01L 25/18*          (2006.01)
    *H01L 23/532*       (2006.01)
    *H01L 21/768*       (2006.01)

(52) U.S. Cl.
    CPC .......... *H01L 23/562* (2013.01); *H01L 23/564* (2013.01); *H01L 23/58* (2013.01); *H01L 23/585* (2013.01); *H01L 24/83* (2013.01); *H01L 25/065* (2013.01); *H01L 25/07* (2013.01); *H01L 25/18* (2013.01); *H01L 21/76898* (2013.01); *H01L 23/53223* (2013.01); *H01L 23/53238* (2013.01); *H01L 23/53252* (2013.01); *H01L 2224/06505* (2013.01); *H01L 2224/09505* (2013.01); *H01L 2224/14505* (2013.01); *H01L 2224/17505* (2013.01); *H01L 2224/2919* (2013.01); *H01L 2224/29186* (2013.01); *H01L 2224/29191* (2013.01); *H01L 2224/83895* (2013.01); *H01L 2225/06558* (2013.01); *H01L 2924/0002* (2013.01)

(58) Field of Classification Search
    CPC . H01L 25/074; H01L 25/0756; H01L 25/117; H01L 21/768; H01L 24/83; H01L 24/12; H01L 24/13; H01L 24/14; H01L 23/585; H01L 23/562; H01L 23/564; H01L 2224/26125; H01L 23/528; H01L 2224/0226; H01L 2224/0219; H01L 2224/02163; H01L 2224/02233; H01L 2224/06505; H01L 2224/06515; H01L 2224/09505; H01L 2224/09515; H01L 2224/14505; H01L 2224/73204; H01L 2224/73104; H01L 2224/29191; H01L 2224/2919; H01L 2224/29188; H01L 2224/29186; H01L 2224/32145; H01L 2224/16147; H01L 2224/16111; H01L 2224/17517; H01L 2224/1515; H01L 2224/17505; H01L 2224/14517; H01L 2224/14515; H01L 2224/16145
    See application file for complete search history.

(56) References Cited

U.S. PATENT DOCUMENTS

| | | | |
|---|---|---|---|
| 8,749,027 B2* | 6/2014 | Chen | H01L 23/481 257/620 |
| 2002/0074670 A1* | 6/2002 | Suga | H01L 21/768 257/777 |
| 2004/0219763 A1* | 11/2004 | Kim | H01L 21/76804 438/455 |
| 2005/0161795 A1 | 7/2005 | Tong et al. | |
| 2007/0018331 A1 | 1/2007 | Chen | |
| 2007/0029646 A1* | 2/2007 | Voldman | H01L 23/60 257/662 |
| 2007/0069364 A1* | 3/2007 | Kawano | H01L 21/76898 257/698 |
| 2007/0267723 A1* | 11/2007 | Bernstein | H01L 23/481 257/621 |
| 2008/0083959 A1* | 4/2008 | Wu | H01L 23/585 257/416 |
| 2008/0142990 A1* | 6/2008 | Yu | H01L 21/8221 257/777 |
| 2009/0051011 A1 | 2/2009 | Usami | |
| 2009/0102059 A1 | 4/2009 | Ishii | |
| 2009/0111214 A1* | 4/2009 | Christensen | H01L 21/6835 438/109 |
| 2010/0001405 A1* | 1/2010 | Williamson | H01L 23/585 257/774 |
| 2010/0025824 A1* | 2/2010 | Chen | H01L 23/585 257/620 |
| 2010/0187670 A1* | 7/2010 | Lin | H01L 21/76898 257/686 |
| 2010/0187671 A1* | 7/2010 | Lin | H01L 21/76898 257/686 |
| 2011/0101537 A1* | 5/2011 | Barth | H01L 21/76898 257/774 |
| 2011/0168434 A1* | 7/2011 | Farooq | H01L 21/2007 174/257 |
| 2011/0248396 A1* | 10/2011 | Liu | H01L 25/0657 257/686 |
| 2011/0309881 A1* | 12/2011 | Yasuda | H01L 23/642 327/565 |
| 2012/0009789 A1 | 1/2012 | Usami | |
| 2012/0105696 A1* | 5/2012 | Maeda | H01L 21/76898 348/302 |
| 2012/0241981 A1 | 9/2012 | Hirano | |
| 2013/0037965 A1* | 2/2013 | Morimoto | H01L 23/5286 257/774 |
| 2013/0105667 A1* | 5/2013 | Kobayashi | H01L 27/14634 250/208.1 |
| 2013/0112849 A1 | 5/2013 | Shimotsusa | |
| 2013/0285057 A1 | 10/2013 | Ishii | |
| 2013/0285253 A1* | 10/2013 | Aoki | H01L 21/76251 257/774 |
| 2013/0328186 A1* | 12/2013 | Uzoh | H01L 21/76898 257/737 |
| 2014/0124889 A1* | 5/2014 | Qian | H01L 27/14689 257/448 |

FOREIGN PATENT DOCUMENTS

| | | |
|---|---|---|
| JP | 2009-049313 | 3/2009 |
| JP | 2009-105160 | 5/2009 |
| JP | 2009-538528 | 11/2009 |
| JP | 2011-054637 | 3/2011 |
| JP | 2012-019147 | 1/2012 |
| JP | 2012-099742 | 5/2012 |
| JP | 2012-204443 | 10/2012 |
| WO | 2007/139685 | 12/2007 |

OTHER PUBLICATIONS

Written Opinion PCT_JP2014004347 dated Nov. 25, 2014.*
International Search Report of PCT application No. PCT/JP2014/004347 dated Nov. 25, 2014.

* cited by examiner

SEMICONDUCTOR DEVICE AND MANUFACTURING METHOD THEREFOR

RELATED APPLICATIONS

This application is a Continuation of International Application No. PCT/JP2014/004347, filed on Aug. 25, 2014, which in turn claims priority from Japanese Patent Application No. 2013-195378, filed on Sep. 20, 2013, the contents of all of which are incorporated herein by reference in their entireties.

BACKGROUND

1. Field of the Invention

The present disclosure relates to a semiconductor device and a manufacturing method therefor.

2. Description of the Related Art

With higher function and higher performance of electronic devices in recent years, there have been made various studies for achieving higher performance and higher integration of semiconductor devices used in electronic devices. Among these semiconductor devices, a three-dimensional stacked semiconductor device that includes a plurality of stacked semiconductor chips receives attention. In the three-dimensional stacked semiconductor device, it is important to electrically connect two or more stacked semiconductor chips.

As a new technique for bonding a plurality of semiconductor chips, as illustrated in FIG. 5, a direct bonding technique for directly bonding two stacked semiconductor chips 310, 320 together is under consideration (for example, refer to U.S. Patent Publication No. 2005/0161795). First semiconductor chip 31 includes first substrate body 311 which includes a plurality of transistors 312 formed on the principal surface, first wiring layer 313 which covers transistors 312, and first connection layer 314 which includes a plug. First seal ring 302a which includes the plug is disposed from first wiring layer 313 through first connection layer 314. Similarly, second semiconductor chip 320 includes second substrate body 321 which includes a plurality of transistors 322 formed on the principal surface, second wiring layer 323 which covers transistors 322, and second connection layer 324 which includes a plug. Second seal ring 302b which includes the plug is disposed from second wiring layer 323 through second connection layer 324.

As a method for directly bonding two semiconductor chips 310, 320 together, several methods are under consideration. These methods are, for example, a method of cleaning joint surfaces 301 between semiconductor chips 310, 320 to form dangling bonds and covalently bonding the formed dangling bonds to each other, a method of forming a metallic bond of the same kind of metals, and a method of providing amino groups (NHx) or hydroxyl groups (OH) on joint surfaces 301 to form a hydrogen bond or the like. In the direct bonding, it is possible to obtain a covalent bond after bonding by dehydration using a heat treatment at a lower temperature than a temperature in melt-bonding through a bump.

Semiconductor chips can be directly bonded together at room temperature. Thus, it is possible to further reduce a pitch between electrodes than in melt-bonding, which contributes to miniaturization of semiconductor chips. This technique is called direct bonding or room temperature bonding. In the present specification, this technique is called direct bonding. The "direct bonding" described in the present specification means that a metallic bond is formed between metals, or that a covalent bond is formed between insulating films.

As illustrated in FIG. 5, there is generally employed in semiconductor chips 310, 320 a structure in which seal ring 302 surrounds a circuit portion in order to prevent a crack from propagating to the circuit portion, which is generated during dicing for cutting a wafer having the circuit portion into individual chips. Seal ring 302 is formed by directly bonding first seal ring 302a and second seal ring 302b each of which penetrates each circuit part from a lower part through an upper part and is made of a metal. Seal ring 302 also has a role of preventing water from infiltrating into the circuit portion from side surfaces of chips after dicing.

In particular, in a three-dimensional stacked semiconductor device that is made by direct bonding, there is proposed a structure that includes a seal ring continuously formed to connect two silicon substrates by directly bonding metal seal rings formed on the respective silicon substrates at junction interfaces (for example, refer to Unexamined Japanese Patent Publication No. 2012-204443, in particular, FIGS. 9, 10 and 11).

SUMMARY

One aspect of a semiconductor device according to the present disclosure includes: a first substrate having a first substrate body, and having a first element on a first principal surface of the first substrate body; and a second substrate having a second substrate body, and having a second element on a second principal surface of the second substrate body. The first substrate and the second substrate are bonded together with the first principal surface and the second principal surface facing each other. The first substrate includes a first surface film that is an insulating film as an uppermost layer on the first principal surface, a first electrode disposed in a first opening of the first surface film. a second surface film that is an insulating film disposed in a second opening of the first surface film, and a first seal ring disposed under the second surface film. The second substrate includes a third surface film that is an insulating film as an uppermost layer on the second principal surface, a second electrode disposed in a third opening of the third surface film, a fourth surface film that is an insulating film disposed in a fourth opening of the third surface film, and a second seal ring disposed under the fourth surface film. The first electrode and the second electrode are disposed facing each other and directly bonded together. The first surface film and the third surface film are disposed facing each other and directly bonded together. The second surface film and the fourth surface film are disposed facing each other and directly bonded together. A bottom surface of the second surface film is directly connected to the first seal ring. A bottom surface of the fourth surface film is directly connected to the second seal ring. A seal ring formed of the first seal ring, the second surface film, the fourth surface film, and the second seal ring is continuous between the first substrate and the second substrate.

One aspect of a method for manufacturing a semiconductor device according to the present disclosure is a method for manufacturing a semiconductor device including a first substrate having a first substrate body, and having a first element on a first principal surface of the first substrate body and a second substrate having a second substrate body, and having a second element on a second principal surface of the second substrate body, the first substrate and the second substrate being bonded together with the first principal surface and the second principal surface facing each other. The method includes step (a), step (b), step (c), step (d), and step (e). The step (a) is forming a first wiring layer including a first seal ring on the first principal surface, and forming a second wiring layer including a second seal ring on the second principal surface. The step (b) is forming a first surface film that is an insulating film as an uppermost layer on the first principal surface, and forming a second surface film that is an insulating film as an uppermost layer on the second principal surface. The step (c) is forming a first opening in the first surface film at a position above the first seal ring and forming a third surface film in the first opening, the third surface film being an insulating film directly connected to the first seal ring, and forming a second opening in the second surface film at a position above the second seal ring and forming a fourth surface film in the second opening, the fourth surfaced film being an insulating film directly connected to the second seal ring. The step (d) is forming a third opening in a predetermined region of the first surface film and disposing a first conductive film in the third opening to form a first electrode, and forming a fourth opening in a predetermined region of the second surface film and disposing a second conductive film in the fourth opening to form a second electrode. The step (e) is bonding the first substrate and the second substrate together after the step (c) and the step (d) in such a manner that the first surface film and the second surface film face each other, the third surface film and the fourth surface film face each other, and the first electrode and the second electrode face each other. In the step (e), surfaces of the first surface film, the third surface film, and the first electrode are planarized so as to be flush with one another in the first substrate, surfaces of the second surface film, the fourth surface film, and the second electrode are planarized so as to be flush with one another in the second substrate, and the first substrate and the second substrate are then directly bonded together with the first principal surface and the second principal surface facing each other.

Another aspect of the method for manufacturing a semiconductor device according to the present disclosure is a method for manufacturing a semiconductor device including a first substrate having a first substrate body, and having a first element on a first principal surface of the first substrate body and a second substrate having a second substrate body, and having a second element on a second principal surface of the second substrate body, the first substrate and the second substrate being bonded together with the first principal surface and the second principal surface facing each other. The method includes step (a), step (b), step (c), step (d), step (e) and step (f). The step (a) is forming a first wiring layer including a first seal ring on the first principal surface, and forming a second wiring layer including a second seal ring on the second principal surface. The step (b) is forming a first surface film that is an insulating film as an uppermost layer on the first principal surface, and forming a second surface film that is an insulating film as an uppermost layer on the second principal surface. The step (c) is forming a first opening in the first surface film at a position above the first seal ring and forming a second opening in a predetermined region of the first surface film, the second opening having a greater opening width in a short-side direction than the first opening in plan view, and forming a third opening in the second surface film at a position above the second seal ring and forming a fourth opening in a predetermined region of the second surface film, the fourth opening having a greater opening width in a short-side direction than the third opening in plan view. The step (d) is forming a first insulating film on the first surface film so as to extend into the first opening and along a bottom surface and a side surface of the second opening and then performing etch back on the first insulating film to form a third surface film disposed in the first opening and a fourth surface film disposed only on the side surface of the second opening, and forming a second insulating film on the second surface film so as to extend into the third opening and along a bottom surface and a side surface of the fourth opening and then performing etch back on the second insulating film to form a fifth surface film disposed in the third opening and a sixth surface film disposed only on the side surface of the fourth opening after the step (c). The step (e) is disposing a first conductive film on the first surface film to form a first electrode in the second opening, and disposing a second conductive film on the second surface film to form a second electrode in the fourth opening after the step (d). The step (f) is bonding the first substrate and the second substrate together after the step (e) in such a manner that the first surface film and the second surface film face each other, the third surface film and the fifth surface film face each other, the fourth surface film and the sixth surface film face each other, and the first electrode and the second electrode face each other. In the step (f), surfaces of the first surface film, the third surface film, the fourth surface film, and the first electrode are planarized so as to be flush with one another in the first substrate, surfaces of the second surface film, the fifth surface film, the sixth surface film, and the second electrode are planarized so as to be flush with one another in the second substrate, and the first substrate and the second substrate are then directly bonded together with the first principal surface and the second principal surface facing each other.

The semiconductor device and the method for manufacturing the semiconductor device of the present disclosure make it possible to stably form a seal ring that is continuous among a plurality of semiconductor chips stacked by direct bonding and to obtain a three-dimensional stacked semiconductor device provided with a seal ring having high reliability.

DETAILED DESCRIPTION OF THE PREFERRED EMBODIMENTS

Figure 1:
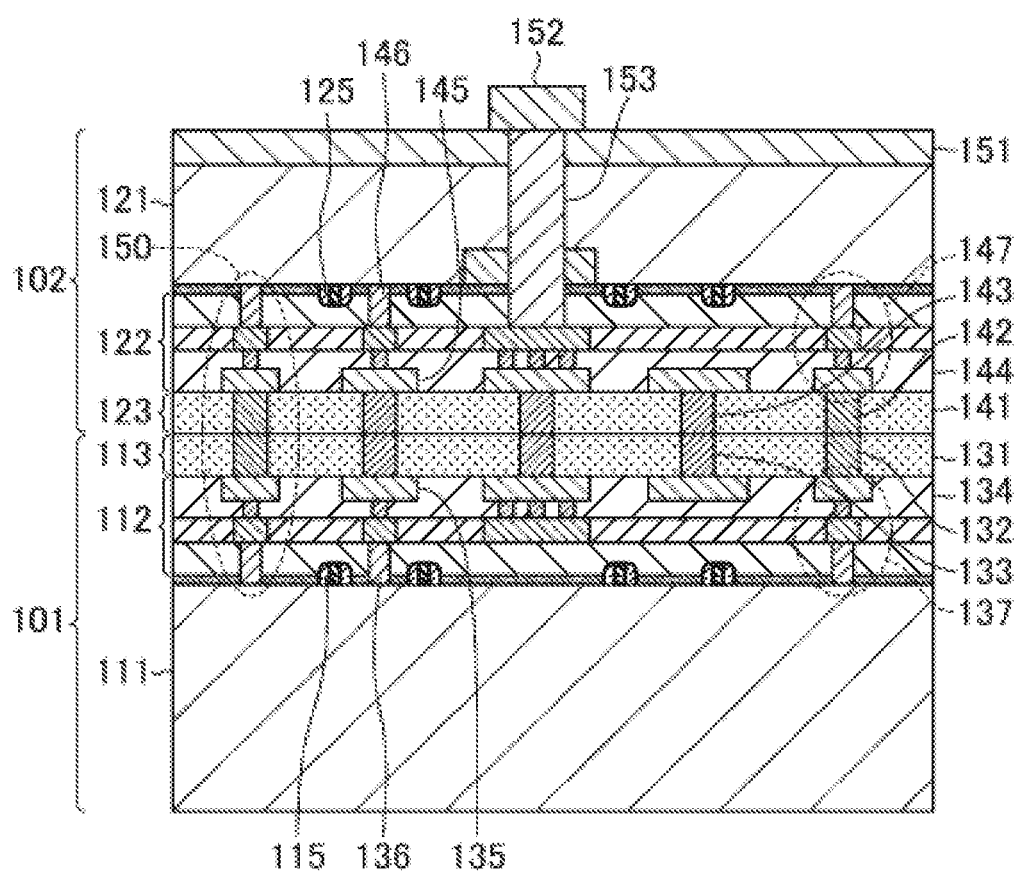
FIG. 1 is a schematic sectional view illustrating a semiconductor device according to a first exemplary embodiment.

It is difficult to stably form a metal seal ring that is continuous among a plurality of semiconductor chips stacked by direct bonding because of the following reason.

In order to connect semiconductor chips by direct bonding, surfaces of silicon substrates to be bonded are required to be extremely flat surfaces, for example, having a surface roughness Ra of less than 2 nm. A CMP (chemical mechanical polishing) method is used to achieve this state. It is known that, when CMP is performed on a surface that has both an insulating film and a metal film, a surface of the metal film is recessed downward with respect to a surface of the insulating film. This phenomenon is called dishing and mainly caused by selective polishing of wiring. Specifically, when a metal film such as a copper (Cu) film is polished, it is necessary to perform CMP with a strong effect of a chemical polishing component. Thus, wiring is selectively polished.

Further, a polishing pad selectively polishes a wiring while the polishing pad is warping. Thus, dishing tends to become deeper in wider wiring that is likely to cause warpage of the polishing pad. Since a seal ring is typically made of a metal film having a relatively large width (for example, >1 μm), deep dishing is formed. Meanwhile, when only an insulating film is polished, it is not necessary to oxidize a material to be polished before polishing as performed in Cu polishing. Thus, it is possible to perform CMP with a weak effect of a chemical polishing component. As a result, no dishing occurs.

Bonding of metal films in direct bonding is achieved by performing a heat treatment after bonding insulating films to each other using an intermolecular force at room temperature. A metal film used in wiring such as copper (Cu) or aluminum (Al) has a higher CTE (coefficient of thermal expansion) than an insulating film such as a silicon oxide (SiOx) film, a silicon nitride (SiNx) film, or a silicon carbonitride (SiCNx) film. Thus, the metal film relatively expands by a heat treatment inside a wiring groove formed in an insulating film.

When dishing is shallow, thermal expansion of each metal film can restore a recessed part caused by the dishing, and metal films can thus be completely bonded to each other. However, when dishing is deep, a recessed part caused by the dishing cannot be restored by thermal expansion. As a result, a space region in which metals are not bonded, which is a void, remains in the metal bonding part.

A metallic bond that generates no void in a metal bonding part is required in a seal ring to ensure resistance to crack. However, in conventional techniques, it is difficult to form a seal ring having no void in a metal bonding part because of the above reason.

In view of the above problem, the present disclosure makes it possible to stably form a seal ring that is continuous among a plurality of semiconductor chips stacked by direct bonding and to form a seal ring having high reliability.

That is, in the present disclosure, a semiconductor device has a configuration that includes an insulating member at least in a joint part in a seal ring formed in each of a plurality of semiconductor chips.

Hereinbelow, exemplary embodiments will be described in detail with reference to the drawings in an appropriate manner. However, unnecessarily detailed description may be omitted. For example, detailed description of an already well-known matter and overlapping description of substantially the same configurations may be omitted in order to avoid the following description from becoming unnecessarily redundant and to make it easy for a person skilled in the art to understand the following description.

The accompanying drawings and the following description are provided so that a person skilled in the art can sufficiently understand the present disclosure. Therefore, the accompanying drawings and the following description are not intended to limit the subject matter defined in the claims.

First Exemplary Embodiment

Hereinbelow, a semiconductor device according to a first exemplary embodiment will be described with reference to FIG. 1.

As illustrated in FIG. 1, the semiconductor device according to the first exemplary embodiment is a three-dimensional stacked semiconductor device which includes first substrate 101 and second substrate 102. First substrate 101 and second substrate 102, each of which is a semiconductor chip, are stacked.

First substrate 101 includes first substrate body 111 which is made of, for example, silicon, first wiring layer 112 which is formed on a principal surface of first substrate body 111, and first surface layer 113 which is formed on first wiring layer 112. Second substrate 102 includes second substrate body 121 which is made of, for example, silicon, second wiring layer 122 which is formed on a principal surface of second substrate body 121, and second surface layer 123 which is formed on second wiring layer 122. In FIG. 1, first wiring layer 112 and second wiring layer 122 each include three layers of interlayer insulating film and two layers of wiring. However, the present disclosure is not limited to this configuration, and first wiring layer 112 and second wiring layer 122 may each include four or more layers of interlayer insulating film and three or more layers of wiring.

First surface layer 113 of first substrate 101 includes first surface film 131 and second surface film 132 each of which is an insulating film, and first electrode 133 which is a conductive film. Second surface layer 123 of second substrate 102 includes third surface film 141 and fourth surface film 142 each of which is an insulating film, and second electrode 143 which is a conductive film.

First substrate 101 and second substrate 102 are directly bonded together with first surface layer 113 and second surface layer 123 facing each other. First surface film 131 and third surface film 141 which face each other are integrated by a covalent bond. Second surface film 132 and fourth surface film 142 which face each other are integrated by a covalent bond. Second surface film 132 and fourth surface film 142 are respectively directly connected to first seal ring 137 and second seal ring 147 (described below) with no break, that is, with no void and function as a part of seal ring 150 which penetrates a region between a principal surface of first substrate body 111 and a principal surface of second substrate body 121, the principal surfaces facing each other. That is, seal ring 150 includes first seal ring 137, second surface film 132, fourth surface film 142, and second seal ring 147 which are formed continuously enough to prevent generation of a void. Continuous seal ring 150 means that seal ring 150 which extends across first substrate 101 and second substrate 102 which are stacked is formed in such a manner that junction interfaces of second surface film 132 and fourth surface film 142 which are bonded together are in intimate contact with each other.

In FIG. 1, one seal ring 150 is disposed on each of right and left end parts of a bonded body of first substrate 101 and second substrate 102. However, a plurality of seal rings 150 may be formed on each of the right and left end parts. First electrode 133 and second electrode 143 are integrated by a metallic bond and electrically connected to each other.

Although not illustrated in FIG. 1, alignment deviation between first substrate 101 and second substrate 102 during direct bonding may cause direct bonding between a part of first surface film 131 and a part of fourth surface film 142 and between a part of third surface film 141 and a part of second surface film 132. However, alignment deviation in some degree has no particular problem in operation and reliability as a semiconductor device.

Circuit elements including a plurality of transistors 115 are provided on first substrate body 111. First wiring layer 112 includes first interlayer film 134 which is an insulating film, a plurality of first conductive films 135, and a plurality of contact plugs 136. Each of first conductive films 135 serves as wiring, a pad, and a via plug. As described above, first interlayer film 134 and first conductive film 135 may each include a combination of a plurality of films. First conductive films 135 are connected to transistors 115 through contact plugs 136 and connected to first electrode 133.

Some of first conductive films 135 and some of contact plugs 136 form a part of first seal ring 137 which surrounds the circuit elements. Insulating second surface film 132 is directly formed on first seal ring 137. Thus, first seal ring 137 is not electrically connected to first electrode 133 and transistors 115.

Circuit elements including a plurality of transistors 125 are provided on second substrate body 121. Second wiring layer 122 includes second interlayer film 144 which is an insulating film, a plurality of second conductive films 145, and a plurality of contact plugs 146. Each of second conductive films 145 serves as wiring, a pad, and a via plug. As described above, second interlayer film 144 and second conductive film 145 may each include a combination of a plurality of films. Second conductive films 145 are connected to transistors 125 through contact plugs 146 and connected to second electrode 143.

Some of second conductive films 145 and some of contact plugs 146 form a part of second seal ring 147 which surrounds the circuit elements. Insulating fourth surface film 142 is directly formed on second seal ring 147. Thus, second seal ring 147 is not electrically connected to second electrode 143 and transistors 125.

First surface film 131 and third surface film 141 may each be formed of stacked films.

First interlayer film 134 and second interlayer film 144 may each be formed of, for example, silicon oxide (SiOx), silicon nitride (SiNx), carbon-containing silicon nitride (SiCxNy), carbon-containing silicon oxide (SiCxOy), or methyl siloxane (SiOx(CH3)y). First conductive film 135 and second conductive film 145 may each be formed of a low-resistance metal such as copper (Cu), aluminum (Al), or silver (Ag). Anti-diffusion layers which are each made of a high-melting point metal such as tantalum (Ta), titanium (Ti), cobalt (Co), manganese (Mn) or zirconium (Zr), or a nitride of these materials may be disposed between first conductive film 135 and first interlayer film 134 and between second conductive film 145 and second interlayer film 144. By providing the anti-diffusion layer, it is possible to prevent diffusion of metal material that constitutes a conductive film into an interlayer film and to improve adhesion between a conductive film and an interlayer film.

First interlayer film 134 and second interlayer film 144 may be made of the same material or may be made of different materials. When first interlayer film 134 and second interlayer film 144 are each formed of stacked films, the films may be made of the same material or may be made of different materials. First conductive film 135 and second conductive film 145 may be made of the same material or may be made of different materials. When first conductive film 135 and second conductive film 145 are each formed of stacked films, the films may be made of the same material or may be made of different materials.

First surface film 131 included in first surface layer 113 and third surface film 141 included in second surface layer 123 may each be formed of a silicon compound such as SiOx, SiNx, SiCxNy or SiOxNy, or an organic film such as benzocyclobutene (BCB), polybenzoxazole (PBO) or polyimide (PI). Second surface film 132 and fourth surface film 142 may each be formed of a silicon compound such as SiNx or SiCxNy.

In view of an effect for preventing crack propagation by seal ring 150, second surface film 132 desirably has a higher Young's modulus than first surface film 131, and fourth surface film 142 desirably has a higher Young's modulus than third surface film 141. In view of an effect for preventing water infiltration by seal ring 150, second surface film 132 and fourth surface film 142 desirably have water permeation resistance. For example, when first surface film 131 and third surface film 141 are each made of SiOx and second surface film 132 and fourth surface film 142 are each made of SiNx, the effect for preventing both crack propagation and water infiltration can be obtained.

Both a thickness of first surface film 131 and a thickness of third surface film 141 may be approximately from 0.1 μm to 10 μm both inclusive.

First surface film 131 and third surface film 141 may be made of the same material or may be made of different materials. Second surface film 132 and fourth surface film 142 are preferably made of the same material, and a width of a groove in plan view may be from 1 μm to 10 μm both inclusive.

First electrode 133 included in first surface layer 113 and second electrode 143 included in second surface layer 123 may each be formed of, for example, copper (Cu), aluminum (Al), nickel (Ni), or tungsten (W). When, in plan view, both a width in a short-side direction of a part of first electrode 133 exposed from first surface film 131 and a width in a short-side direction of a part of second electrode 143 exposed from third surface film 141 are approximately from 0.1 μm to 1 μm both inclusive, first electrode 133 and second electrode 143 can be bonded together with no defect during direct bonding. First electrode 133 and second electrode 143 may each have a width of 1 μm or more as long as generation of a void can be prevented.

Anti-diffusion layers each of which is made of a high-melting point metal such as tantalum, titanium, cobalt, manganese or zirconium, or a nitride of these materials may be disposed between first electrode 133 and first surface film 131 and between second electrode 143 and third surface film 141. A thickness of each of the anti-diffusion layers may be 100 nm or less. By providing the anti-diffusion layers, it is possible to prevent diffusion of metal material that constitutes a conductive film into an interlayer film and to improve adhesion between a conductive film and an interlayer film.

First electrode 133 and second electrode 143 may be made of the same material or may be made of different materials.

Second substrate 102 includes protective film 151 which is formed on a surface (rear surface) of second substrate body 121, the surface being located opposite to the principal surface. Protective film 151 may be formed of a silicon compound such as SiOx, SiNx or SiOxNy, or an organic film such as benzocyclobutene (BCB), polybenzoxazole (PBO) or polyimide (PI). A thickness of protective film 151 may be approximately from 0.1 μm to 10 μm both inclusive.

Electrode pad 152 which is made of, for example, aluminum is disposed on protective film 151. Electrode pad 152 is connected to second conductive film 145 formed on second wiring layer 122 via through electrode 153 which penetrates second substrate body 121. Through electrode 153 may have a diameter of approximately from 1 μm to 200 μm both inclusive and may have a value of an aspect ratio of approximately from 1 to 20. Through electrode 153 may be formed of, for example, copper, tungsten, or polysilicon.

Manufacturing Method

Hereinbelow, a method for manufacturing the semiconductor device according to the first exemplary embodiment will be described with reference to FIGS. 2A to 2H.

Figure 2A:
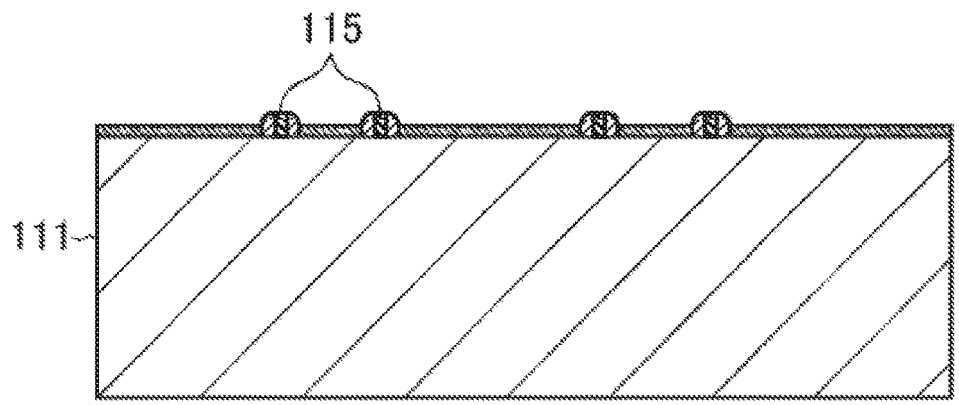
FIG. 2A is a sectional view illustrating a step of a method for manufacturing the semiconductor device according to the first exemplary embodiment.

First, as illustrated in FIG. 2A, first substrate body 111 which includes a plurality of elements including transistors 115 on the principal surface is prepared.

Figure 2B:
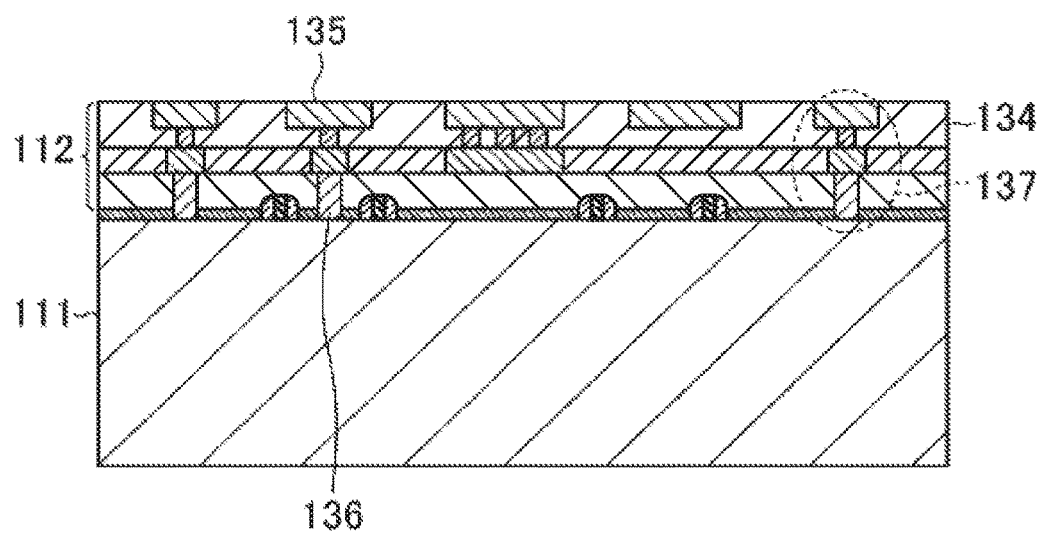
FIG. 2B is a sectional view illustrating a step of the method for manufacturing the semiconductor device according to the first exemplary embodiment.

Then, as illustrated in FIG. 2B, first wiring layer 112 which includes first interlayer film 134, contact plugs 136, and first conductive films 135 is formed on the principal surface of first substrate body 111. First wiring layer 112 may be formed in the following manner. First, a first layer of interlayer film which covers each of transistors 115 is formed. Then, contact holes are formed at predetermined positions on the formed interlayer film and conductive films are embedded in the contact holes to form contact plugs 136. Then, a second layer of interlayer film is formed on the first layer of interlayer film, and wiring grooves are formed at predetermined positions on the formed interlayer film. Then, conductive films are embedded in the formed wiring grooves to form wiring lines. Then, a third layer of interlayer film is formed, and pad grooves and via holes are formed at predetermined positions on the formed interlayer film. First conductive films 135 are embedded in the pad grooves and via holes to form pads and vias which connect wiring lines to pads. First seal ring 137 is simultaneously formed by the above steps. Repeatedly performing this manufacturing steps enables first wiring layer 112 to include wiring of larger number of layers.

Figure 2C:
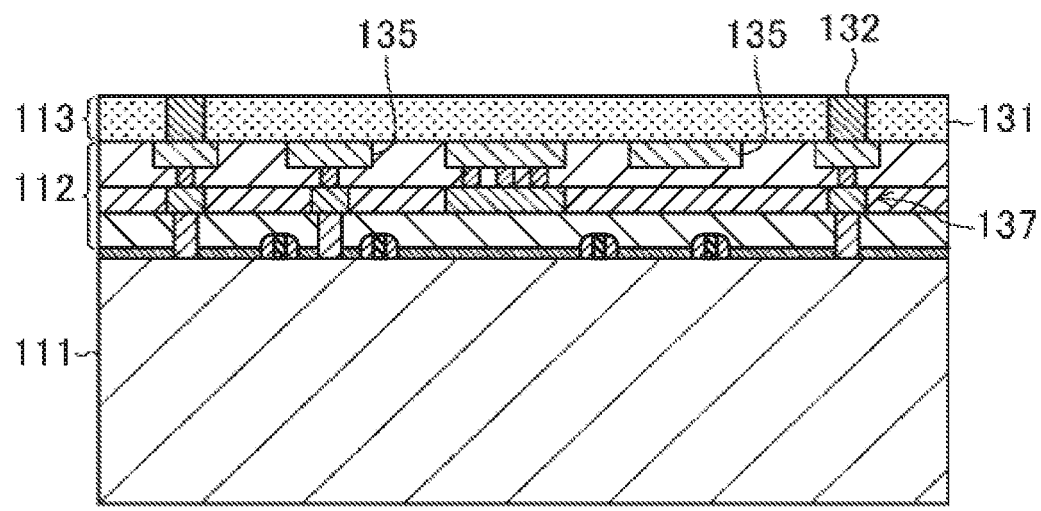
FIG. 2C is a sectional view illustrating a step of the method for manufacturing the semiconductor device according to the first exemplary embodiment.

Then, as illustrated in FIG. 2C, first surface layer 131 which is made of, for example, SiOx, SiNx, SiCxNy, or SiOxNy is formed on first wiring layer 112 by, for example, a CVD (chemical vapor deposition) method or a coating method. Then, lithography and etching are used to form a first opening on first surface film 131 at a position above first seal ring 137, first opening exposing first seal ring 137. Then, second surface film 132 which is made of, for example, SiNx or SiCxNy is embedded in the first opening by a CVD method. Then, planarization is performed by, for example, a CMP method under a condition with a small value of a selection ratio between first surface film 131 and second surface film 132 to form first surface layer 113.

Figure 2D:
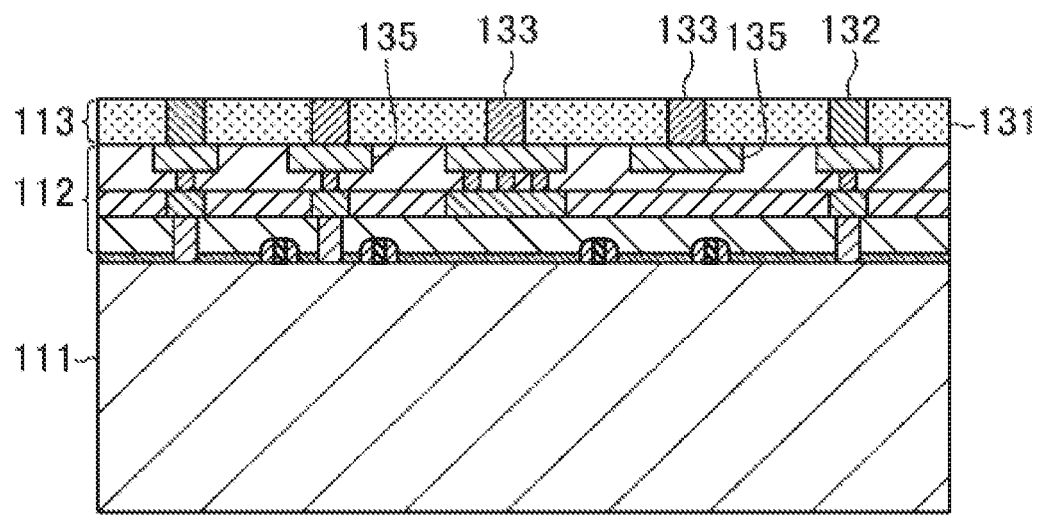
FIG. 2D is a sectional view illustrating a step of the method for manufacturing the semiconductor device according to the first exemplary embodiment.

Then, as illustrated in FIG. 2D, a plurality of first electrodes 133 each of which is a conductive film are formed on first surface film 131. Each of first electrodes 133 may be formed by a wiring forming method such as a damascene method, a semiactive method, or a stacking deposition method for aluminum wiring formation. When a damascene method is used, lithography and etching are used to form openings which expose the pads as first conductive films 135 at predetermined positions on first surface film 131. Then, for example, a PVD (physical vapor deposition) method is used to sequentially form a diffusion barrier film which is made of, for example, tantalum (Ta) or tantalum nitride (TaN) and a copper (Cu) plating seed layer in each of the openings. Then, a plating method is used to embed a copper film into each of the openings. Then, an unnecessary part of the copper film is removed by a CMP method to form each of first electrodes 133. Accordingly, a surface of each of first electrodes 133 is exposed from first surface film 131. A surface of first surface film 131 may be planarized when the unnecessary part of the copper film is removed. For example, an arithmetic average roughness (Ra) per 1 μm$^2$ in first surface film 131 may be 1 nm or less. A size of dishing that occurs by CMP in first electrodes 133 is preferably 100 nm or less.

Figure 2E:
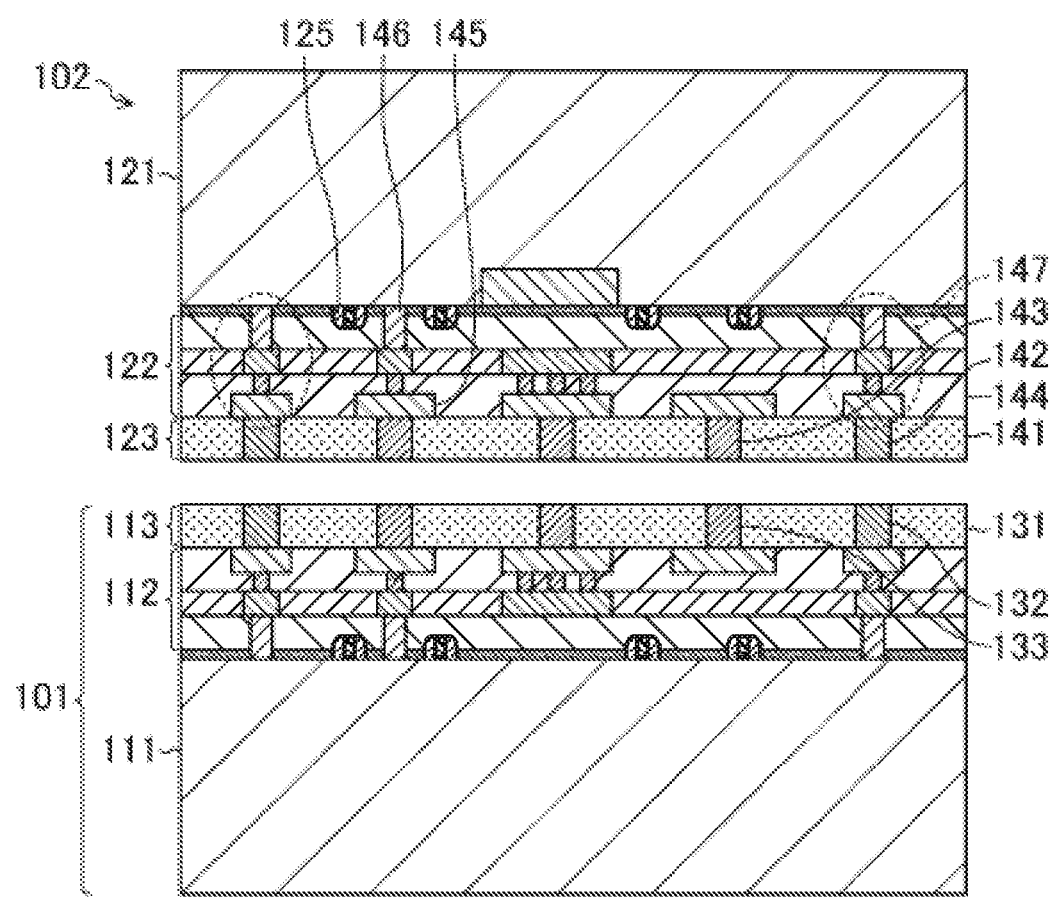
FIG. 2E is a sectional view illustrating a step of the method for manufacturing the semiconductor device according to the first exemplary embodiment.
Figure 2F:
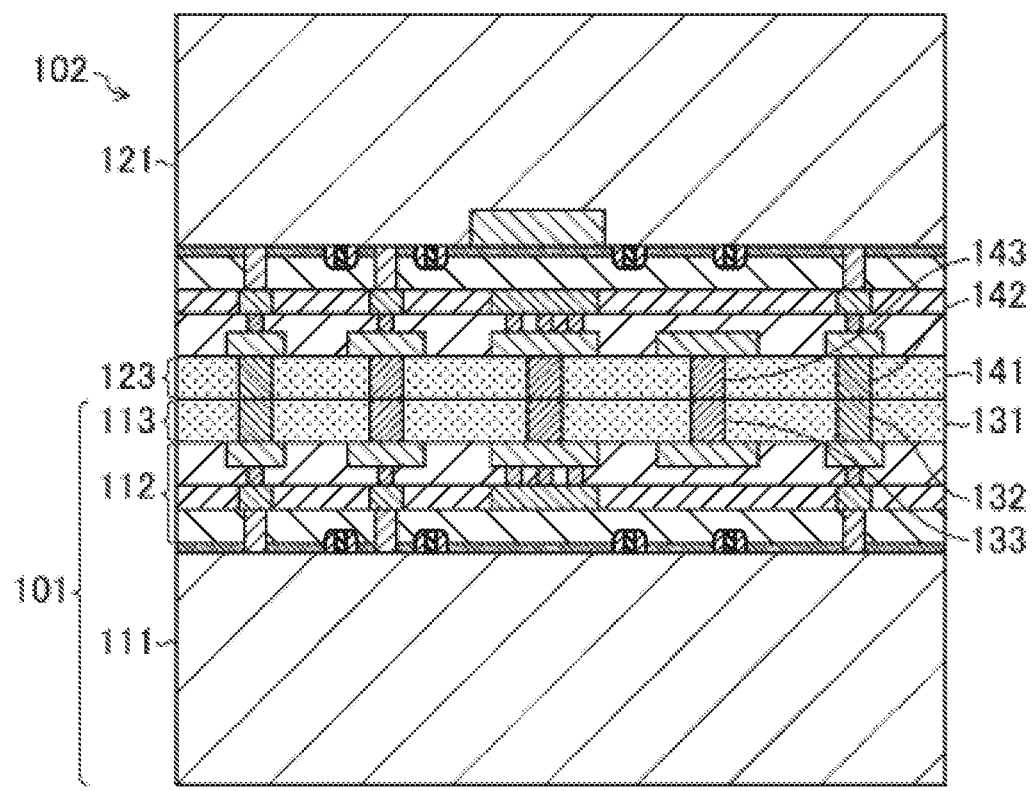
FIG. 2F is a sectional view illustrating a step of the method for manufacturing the semiconductor device according to the first exemplary embodiment.

Then, as illustrated in FIG. 2E, second substrate 102 is prepared. Second substrate 102 may be formed similarly to first substrate 101. Specifically, a plurality of elements including transistors 125, second wiring layer 122 which includes second interlayer film 144 and second conductive film 145, and second surface layer 123 which includes third surface film 141, fourth surface film 142 and second electrodes 143 are formed on second substrate body 121 which is made of, for example, silicon. Second electrodes 143 of second substrate 102 are formed at positions facing first electrodes 133 of first substrate 101. Surfaces of second electrodes 143 are exposed from third surface film 141. Fourth surface film 142 of second substrate 102 is formed at a position facing second surface film 132 of first substrate 101. A surface of second surface layer 123 may be planarized similarly to first surface layer 113.

Then, as illustrated in EEG, 2F, first substrate 101 and second substrate 102 are bonded together by direct bonding with first surface layer 113 and second surface layer 123 facing each other. The direct bonding between first substrate 101 and second substrate 102 may be performed in the following manner. First, a surface of first surface layer 113 and a surface of second surface layer 123 are surface-treated.

As the surface treatment, cleaning may first be performed to remove carbonaceous deposits and reactants from the surface of first surface layer 113 and the surface of second surface layer 123. The cleaning may be wet cleaning using APM (ammonium hydrogen-peroxide mixture) or may be dry cleaning using, for example, plasma, ion, or ozone.

Then, for example, oxygen plasma is applied to the surface of first surface layer 113 and the surface of second surface layer 123 to terminate dangling bonds on first surface film 131, second surface film 132, third surface film 141, and fourth surface film 142 with hydroxyl groups (OH). The treatment using, for example, oxygen plasma is not essential. For example, dangling bonds may be formed in first surface film 131, second surface film 132, third surface film 141, and fourth surface film 142 and held in the atmosphere to terminate the dangling bonds with hydroxyl groups (OH).

After first surface layer 113 and second surface layer 123 are surface-treated, first surface layer 113 and second surface layer 123 are brought into direct contact with each other. Accordingly, a hydrogen bond through a water molecule is generated between first surface film 131 and third surface film 141 and between second surface film 132 and fourth surface film 142, and bonding naturally expands from interfaces that first make contact with each other to surroundings by electrostatic attraction (attractive interaction) by the hydrogen bond. Since cleaned surfaces made of the same kind of metal are brought into contact with each other in electrodes that face each other, a metallic bond is ideally formed between first electrode 133 and second electrode 143. When first surface layer 113 and second surface layer 123 have an overall shape projecting upward, direct bonding between first substrate 101 and second substrate 102 can be easily performed.

Then, for example, a heat treatment may be performed at a temperature of 400° C. or less. The heat treatment after the direct bonding is performed in order to enhance the already formed bond. Thus, the heat treatment has no influence on alignment between the chips during bonding of the chips.

First electrode 133 has a higher CTE (coefficient of thermal expansion) than first surface film 131. Second electrode 143 has a higher CTE than third surface film 141. Thus, first electrode 133 and second electrode 143 are pressure-bonded together by the heat treatment. Further, diffusion of elements is more likely to occur in each contact surface. Accordingly, a connection strength is improved. Further, dehydration occurs in contact surfaces between first surface film 131 and third surface film 141 and between second surface film 132 and fourth surface film 142, which results in a stronger covalent bond. Thus, the reliability is further improved.

The surfaces of first surface film 131, second surface film 132, third surface film 141, and fourth surface film 142 may be terminated with not hydroxyl groups, but amino groups ($NH_2$). A hydrogen bond can be generated between first surface film 131 and third surface film 141 and between second surface film 132 and fourth surface film 142 even with termination with amino groups. For example, nitrogen plasma may be applied to achieve the termination with amino groups.

Dangling bonds may be formed on the surfaces of first surface film 131, second surface film 132, third surface film 141, and fourth surface film 142 instead of the termination. In this case, first surface film 131 and third surface film 141 can be bonded together and second surface film 132 and fourth surface film 142 can be bonded together by connection between the dangling bonds. In formation of the dangling bonds, plasma of an inert gas such as argon (Ar) may be applied, or an ion beam or a plasma beam may be applied. In this case, a metallic bond can be formed between first electrode 133 and second electrode 143 without a heat treatment.

Figure 2G:
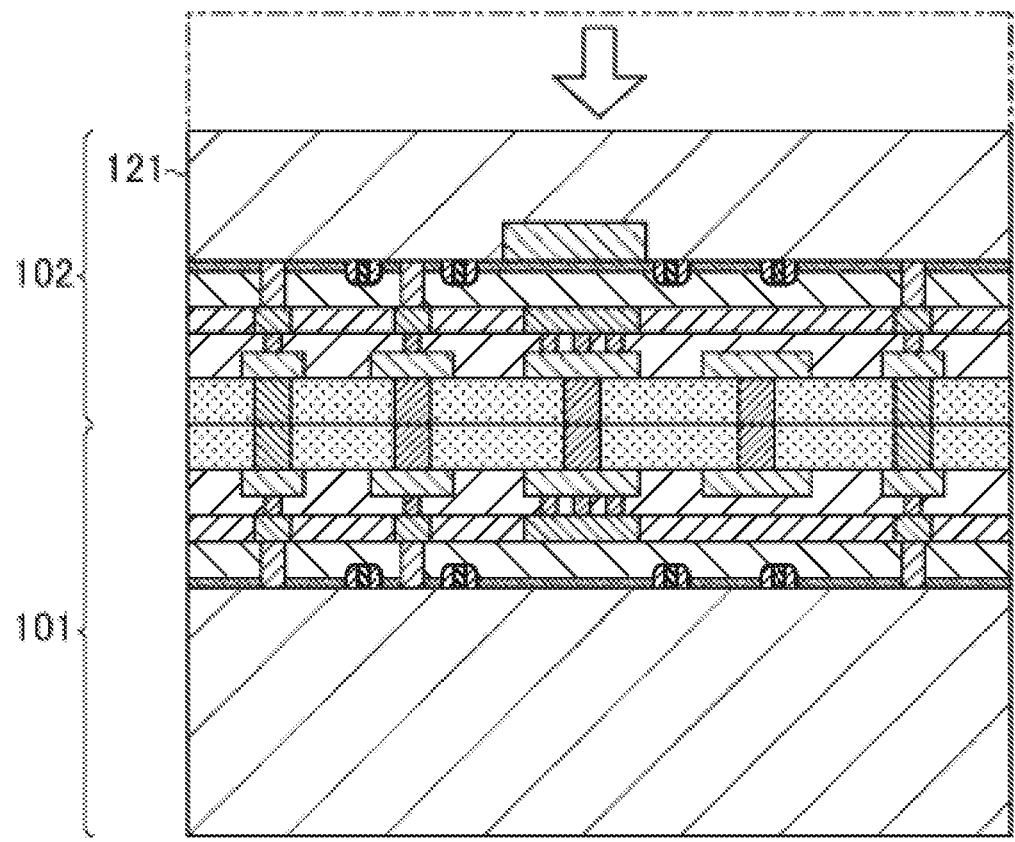
FIG. 2G is a sectional view illustrating a step of the method for manufacturing the semiconductor device according to the first exemplary embodiment.

Then, as illustrated in FIG. 2G, second substrate body 121 is polished from the rear surface so as to make a thickness of second substrate body 121 approximately from 2 μm to 200 μm. For example, a grinder may be used in the polishing.

Figure 2H:
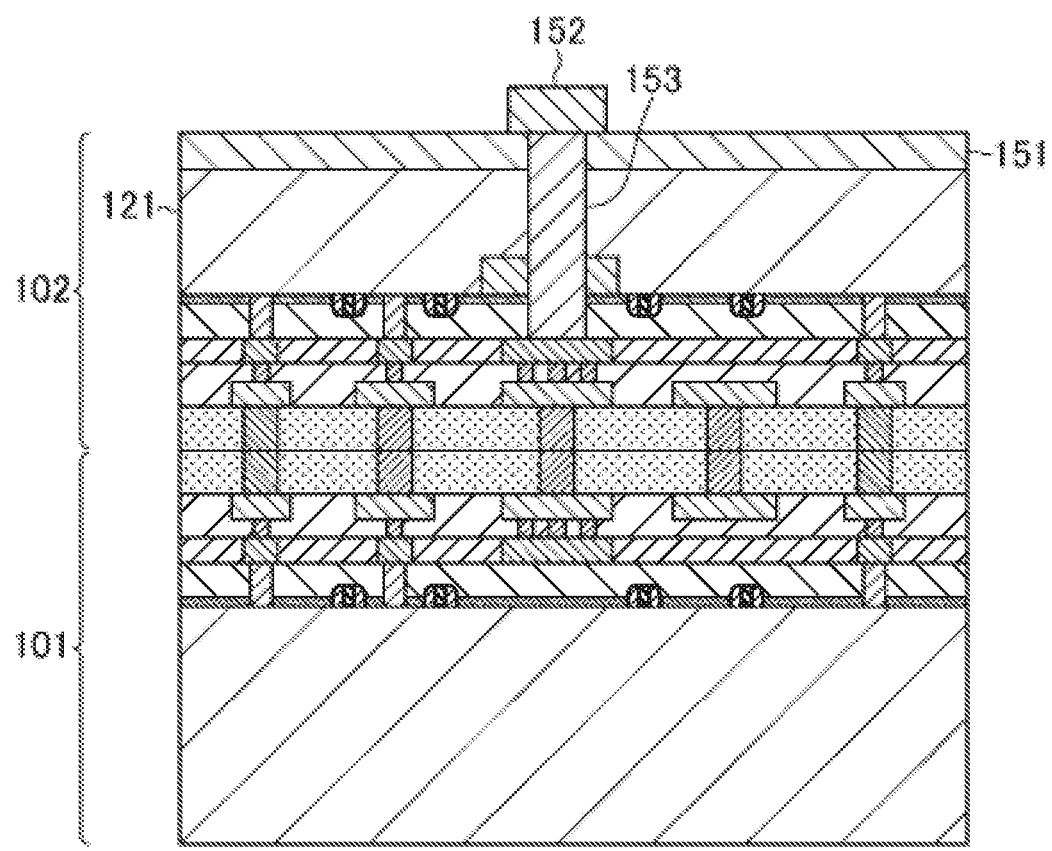
FIG. 2H is a sectional view illustrating a step of the method for manufacturing the semiconductor device according to the first exemplary embodiment.

Then, as illustrated in FIG. 2H, protective film 151 which is made of SiN or BCB is formed on the rear surface of second substrate body 121. Then, through electrode 153 which penetrates second substrate body 121 is formed. Through electrode 153 may be formed in the following manner. First, a through hole which penetrates protective film 151 and second substrate body 121 is formed by lithography and etching. Then, a diffusion barrier film which is made of tantalum or tantalum nitride and a copper plating seed layer are sequentially formed on the entire rear surface of second substrate body 121 including an inside of the through hole by, for example, a PVD method. Then, a copper film is embedded in the through hole by a plating method, and an unnecessary copper film and an unnecessary diffusion barrier layer are removed by a CMP method so as to perform planarization to form through electrode 153. Then, electrode pad 152 is selectively formed on protective film 151 so as to make contact with through electrode 153. Electrode pad 152 may be formed by patterning by lithography and etching after an aluminum film is formed on protective film 151.

In the present exemplary embodiment, only one electrode pad 152 and one through electrode 153 are illustrated. However, a plurality of electrode pads 152 and a plurality of through electrodes 153 may be provided as necessary. Configurations of through electrode 153 and electrode pad 152 are merely examples. Any material and any shape may be used as long as electrical connection can be ensured. For example, polysilicon or tungsten may be used as the material instead of copper. Through electrode 153 may have a configuration in which a conductive material is formed along an inner wall of a through hole to leave a cavity and the cavity is embedded with an insulating film instead of the configuration in which the inside of the through hole is embedded with the conductive material.

Electrode pad 152 may be connected to a mount substrate (not illustrated) through a bump (not illustrated). A third substrate (not illustrated) may further be stacked on second substrate 121. When the third substrate is stacked, direct bonding may be used instead of a bump. When the third substrate is stacked by direct bonding, a layer that has an insulating film and an electrode exposed from the insulating film may be formed also on the rear surface of second substrate body 121 and a surface of the layer may be planarized.

As described above, in the semiconductor device and the method for manufacturing the semiconductor device according to the present exemplary embodiment, second surface film 132 which is an insulating film formed on first surface layer 113 and fourth surface film 142 which is an insulating film formed on second surface layer 123 are used in the interfaces which are directly bonded together as seal ring 150. Thus, when CMP (chemical mechanical polishing) is performed on a metal such as copper (Cu) as conventionally performed, no dishing is generated in the surface of second surface film 132 and the surface of fourth surface film 142. As a result, it is possible to form seal ring 150 with no bonding defect compared to a semiconductor device that includes a metal as a seal ring in bonding interfaces.

In this manner, in the semiconductor device and the method for manufacturing the semiconductor device according to the present exemplary embodiment, seal ring 150 that has no crack and no water infiltration in an element region and has high reliability can be formed. Thus, it is possible to stably form a three-dimensional stacked semiconductor device.

In the present exemplary embodiment, although metal material is used as the constituent material of first seal ring 137 and second seal ring 147, the constituent material is not limited to metal material. For example, the insulating material used in second surface film 132 and fourth surface film 142 may have a higher Young's modulus and higher water permeation resistance than first surface film 131 and third surface film 141.

In the present exemplary embodiment, electrode pad 152 is disposed on protective film 151 on the rear surface of second substrate body 121. Alternatively, electrode pad 152 may be disposed on a rear surface of first substrate body 111 with protective film 151 interposed therebetween. In this case, through electrode 153 may be formed on first substrate body 111. Further, electrode pads 152 and thorough electrodes 153 may be disposed on both first substrate body 111 and second substrate body 121.

In the present exemplary embodiment, although the transistors as elements are disposed in both first substrate body 111 and second substrate body 121, transistors may be disposed on only one of first substrate body 111 and second substrate body 121. In the present exemplary embodiment, although each of the transistors is a planar transistor, a transistor of fin FET or another shape may be provided. Further, various types of transistors may be provided in a mixed manner.

In the present exemplary embodiment, although wiring included in first wiring layer 112 and wiring included in second wiring layer 122 each include two layers, first wiring layer 112 and second wiring layer 122 may each be a multilayer wiring layer that includes three or more wiring layers as described above. A number of layers of wiring included in first wiring layer 112 may differ from a number of layers of wiring included in second wiring layer 122.

In the present exemplary embodiment, although a size including a shape of second surface film 132 and a size including a shape of fourth surface film 142 are the same, the size of second surface film 132 may differ from the size of fourth surface film 142. When a plurality of first electrodes 133 and a plurality of second electrodes 143 are provided, electrodes having different sizes may be provided in a mixed manner.

In the present exemplary embodiment, as described above, alignment deviation between first substrate 101 and second substrate 102 during bonding may cause direct bonding between a part of first surface film 131 and a part of fourth surface film 142 and between a part of second surface film 132 and a part of third surface film 141. However, also in such a case, the effect of the present exemplary embodiment is exhibited.

Second Exemplary Embodiment

Hereinbelow, a semiconductor device according to a second exemplary embodiment will be described with reference to FIG. 3.

Figure 3:
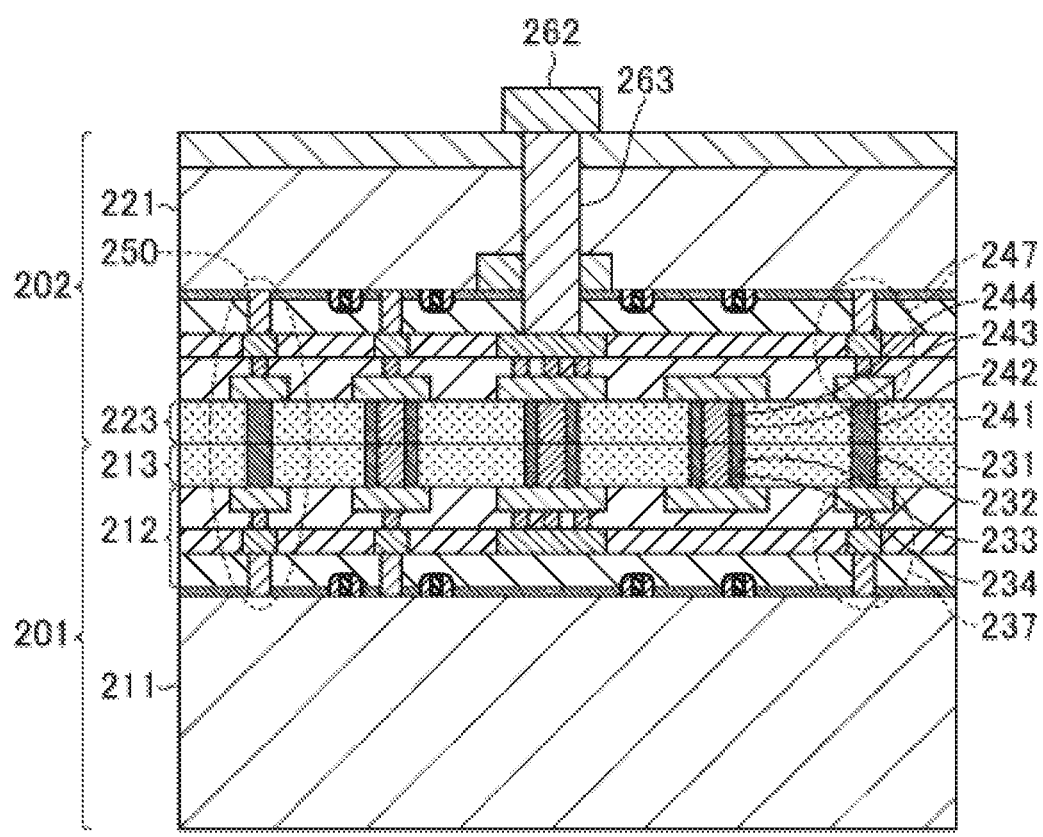
FIG. 3 is a schematic sectional view illustrating a semiconductor device according to a second exemplary embodiment of the present disclosure.

As illustrated in FIG. 3, the semiconductor device according to the second exemplary embodiment is a three-dimensional stacked semiconductor device which includes first substrate 201 and second substrate 202 which are stacked.

A configuration of the semiconductor device according to the present exemplary embodiment is substantially the same as the configuration of the semiconductor device of the first exemplary embodiment, and a difference from the first exemplary embodiment is a configuration of first surface layer 213 and a configuration of second surface layer 223. Thus, the semiconductor device according to the present exemplary embodiment will be described mainly on the configuration of first surface layer 213 and the configuration of second surface layer 223 with reference to FIG. 3.

As illustrated in FIG. 3, in the semiconductor device according to the present exemplary embodiment, first surface layer 213 includes first surface film 231 which is an insulating film, second surface film 232 and fifth surface film 233, and first electrode 234. Fifth surface film 233 is made of the same material as second surface film 232. A thickness (thickness on an inner wall) of fifth surface film 233 is half or more of a width of a groove for second surface film 232 in plan view.

Second surface layer 223 includes third surface film 241 which is an insulating film, fourth surface film 242 and sixth surface film 243, and second electrode 244. Sixth surface film 243 is made of the same material as fourth surface film 242. A thickness (thickness on an inner wall) of sixth surface film 243 is half or more of a width of a groove for fourth surface film 242 in plan view.

First substrate 201 and second substrate 202 are directly bonded together with first surface layer 213 and second surface layer 223 facing each other. First surface film 231 and third surface film 241 which face each other are integrated by a covalent bond. Second surface film 232 and fourth surface film 242 which face each other are integrated by a covalent bond. Fifth surface film 233 and sixth surface film 243 which face each other are integrated by a covalent bond. Second surface film 232 and fourth surface film 242 are respectively directly bonded to first seal ring 237 and second seal ring 247 (described below) with no break, that is, with no void and function as a part of seal ring 250 which penetrates a region between first substrate body 211 and second substrate body 221.

In FIG. 3, one seal ring 250 is disposed on each of right and left end parts of a bonded body of first substrate 201 and second substrate 202. However, a plurality of seal rings 250 may be formed on each of the right and left end parts. First electrode 234 and second electrode 244 are integrated by a metallic bond and electrically connected to each other. A width of first electrode 234 and a width of second electrode 244 are each preferably from 0.1 μm to 1 μm both inclusive. Even when the width of first electrode 234 and the width of second electrode 244 are each from 1 μm to 10 μm both inclusive, electrical connection can be achieved.

Manufacturing Method

Hereinbelow, a method for manufacturing the semiconductor device according to the second exemplary embodiment will be described with reference to FIGS. 4A to 4F. Steps that are the same as the steps in the manufacturing method according to the first exemplary embodiment will be described in a simplified manner.

Figure 4A:
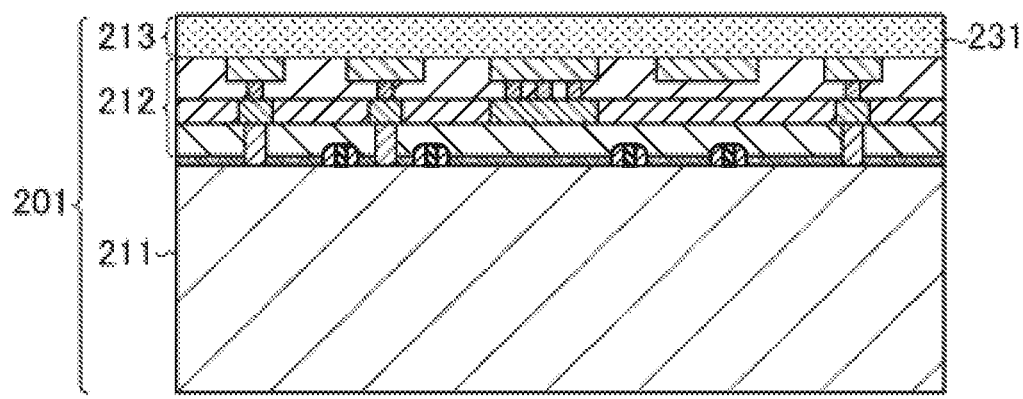
FIG. 4A is a sectional view illustrating a step of a method for manufacturing the semiconductor device according to the second exemplary embodiment.

First, as illustrated in FIG. 4A, first substrate body 211 which includes a plurality of elements including transistors on the principal surface is prepared. Then, similarly to the first exemplary embodiment, first wiring layer 212 which covers the plurality of elements and includes a conductive film is formed on the principal surface of first substrate body 211. Then, first surface film 231 of first surface layer 213 is formed on first wiring layer 212 by, for example, a CVD method or a coating method. First surface film 231 includes an insulating film which is made of for example, SiOx, SiNx, SiCxNy, or SiOxNy.

Figure 4B:
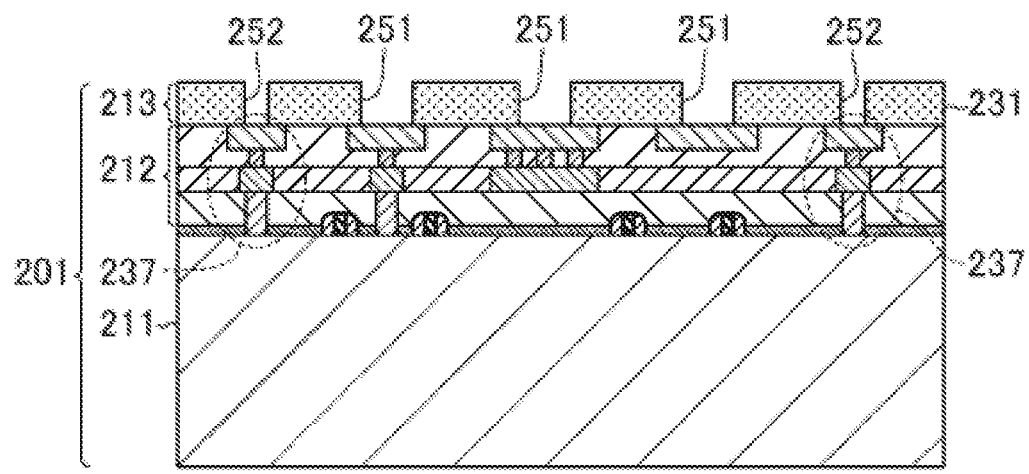
FIG. 4B is a sectional view illustrating a step of the method for manufacturing the semiconductor device according to the second exemplary embodiment.

Then, as illustrated in FIG. 4B, lithography and etching are used to form opening 251 in first surface film 231 at a position above the wiring and form opening 252 in first surface film 231 at a position above first seal ring 237. In the present embodiment, an opening width of opening 251 formed on the wiring is designed to be greater than an opening width of opening 252 formed on first seal ring 237.

Figure 4C:
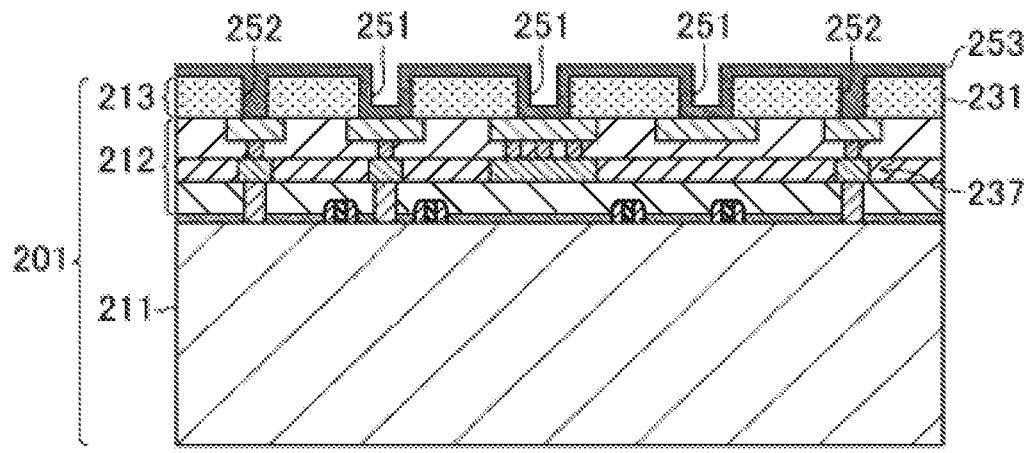
FIG. 4C is a sectional view illustrating a step of the method for manufacturing the semiconductor device according to the second exemplary embodiment.

Then, as illustrated in FIG. 4C, insulating film 253 which is made of, for example, SiNx or SiCxNy is formed on first surface film 231 including opening 251 and opening 252 by a CVD method. A thickness of insulating film 253 is set at half or more of a width in a short-side direction of opening 252 and half or less of a width in a short-side direction of opening 251. Accordingly, insulating film 253 is embedded in opening 252 formed on first seal ring 237 to form second surface film 232. Meanwhile, in opening 251 formed on the wiring, insulating film 253 covers a side surface and a bottom surface of opening 251 and a space is left inside opening 251.

Figure 4D:
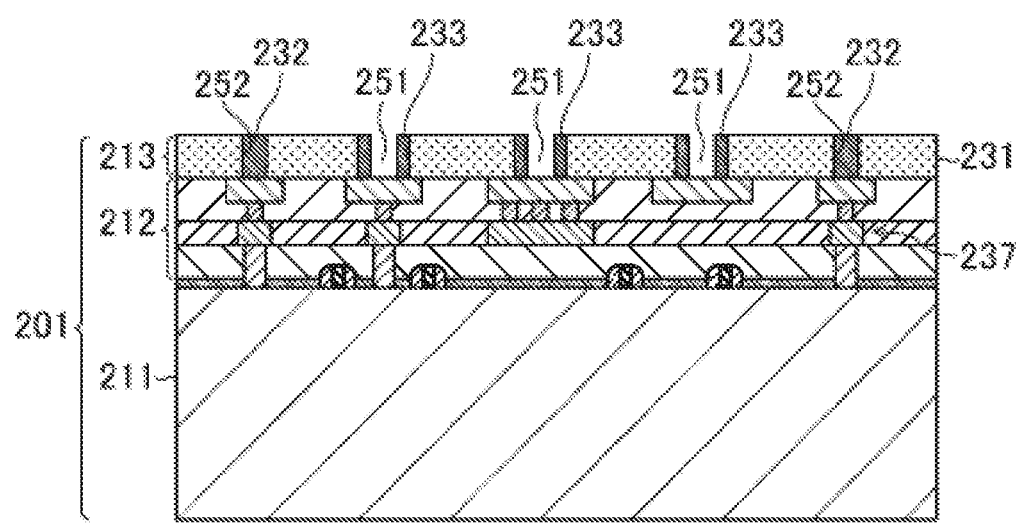
FIG. 4D is a sectional view illustrating a step of the method for manufacturing the semiconductor device according to the second exemplary embodiment.

Then, as illustrated in FIG. 4D, etch back is performed on insulating film 253 to remove an unnecessary part of insulating film 253. Accordingly, insulating film 253 is embedded in opening 252 formed on first seal ring 237. Further, in opening 251 formed on the wiring, insulating film 253 remains only on an inner wall (the side surface of opening 251) and insulating film 253 on the bottom surface is removed so that the wiring of the lower layer (first wiring layer 212) is exposed. That is, second surface film 232 and fifth surface film 233 are formed from insulating film 253.

Figure 4E:
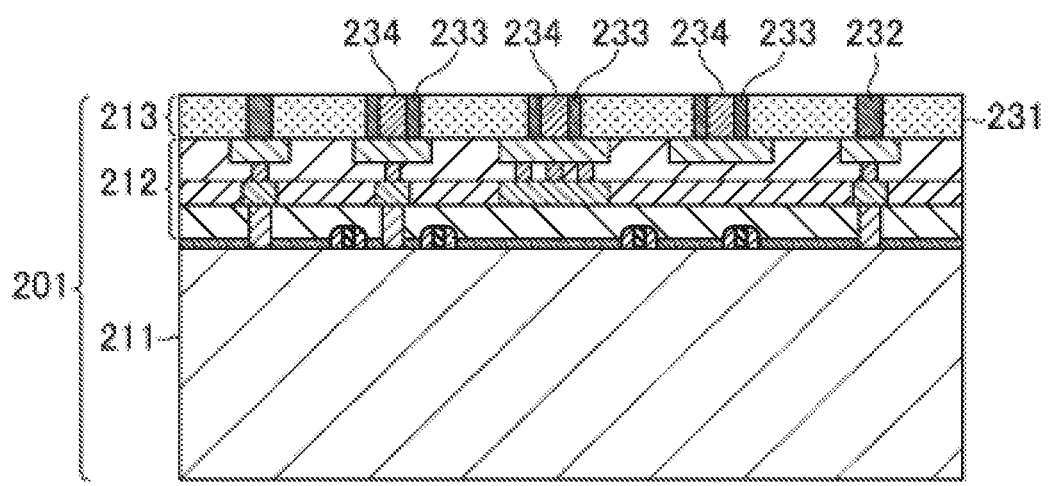
FIG. 4E is a sectional view illustrating a step of the method for manufacturing the semiconductor device according to the second exemplary embodiment.

Then, as illustrated in FIG. 4E, first electrode 234 which is a conductive film is formed. First electrode 234 may be formed using a wiring forming method such as a damascene method, a semiactive method, or a stacking deposition method for aluminum wiring formation similarly to the first exemplary embodiment. Then, for example, an unnecessary part of a copper film is removed by a CMP method to form first electrode 234. Accordingly, a surface of first electrode 234 and a surface of fifth surface film 233 are exposed from first surface film 231. When the unnecessary part of the copper film is removed, a surface of first surface layer 213 may be planarized. For example, an arithmetic average roughness (Ra) per 1 μm² in first surface film 231 may be 1 nm or less. A size of dishing that occurs by CMP in first electrode 234 is preferably 100 nm or less.

Figure 4F:
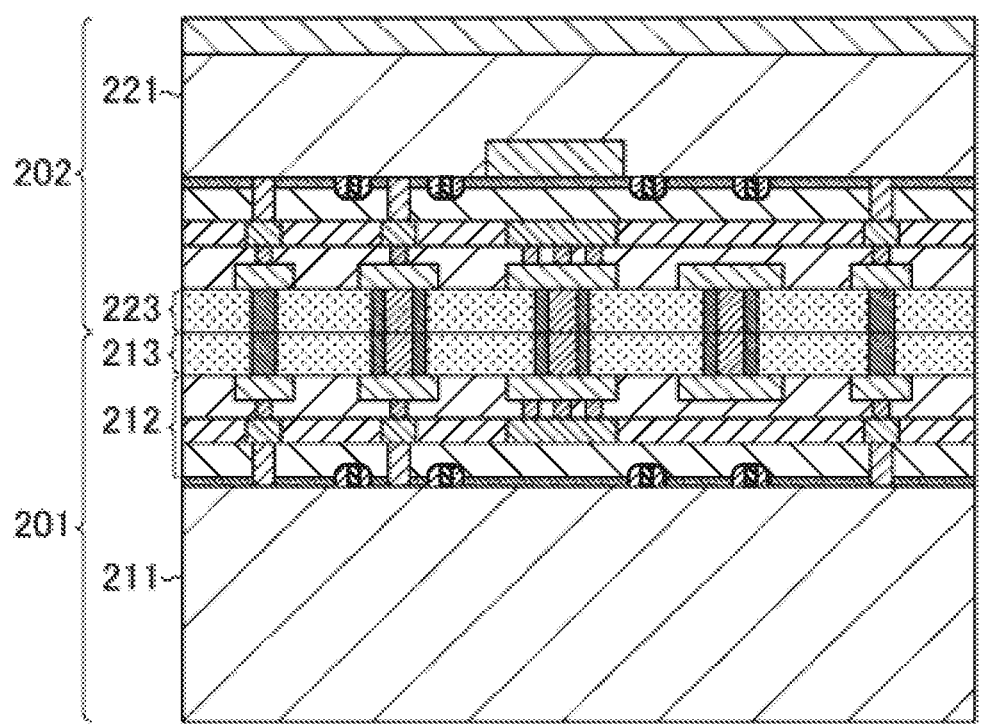
FIG. 4F is a sectional view illustrating a step of the method for manufacturing the semiconductor device according to the second exemplary embodiment.
Figure 5:
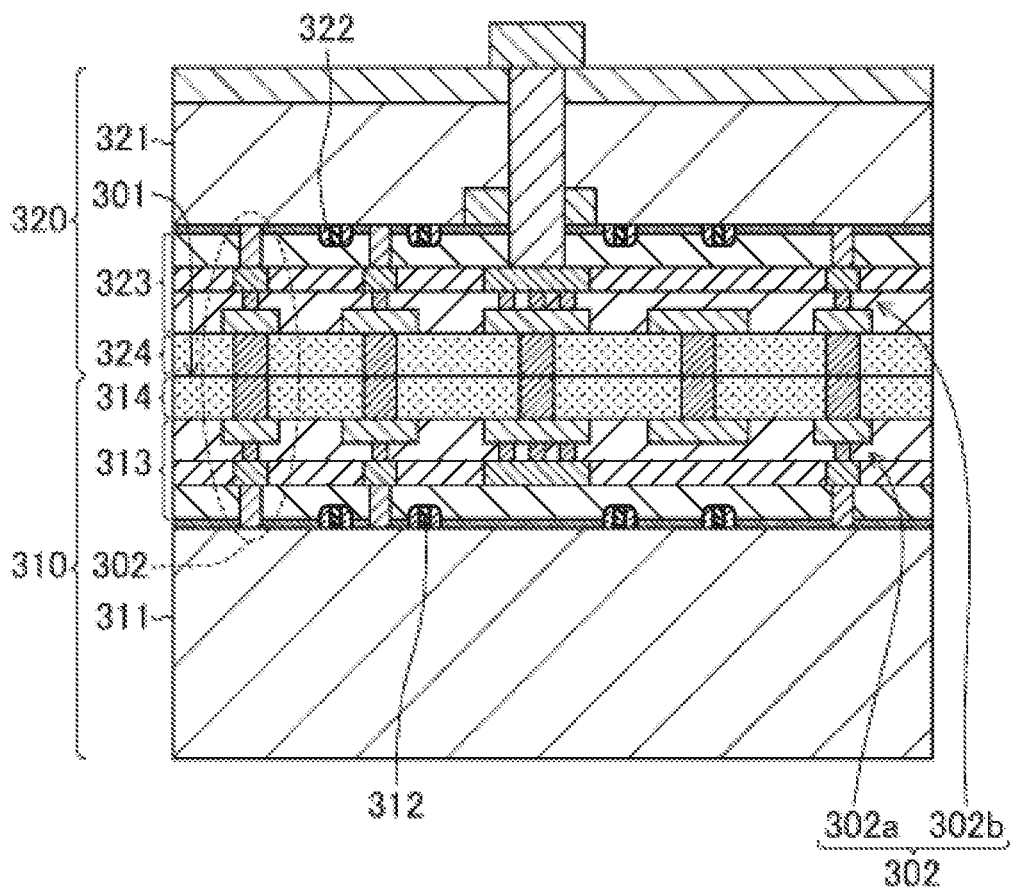
FIG. 5 is a sectional view illustrating a semiconductor device according to a conventional example.

Then, as illustrated in FIG. 4F, second substrate 202 produced by a manufacturing method similar to the manufacturing method of first substrate 201 is prepared. First substrate 201 and second substrate 202 are bonded together by direct bonding with first surface layer 213 and second surface layer 223 facing each other similarly to the manufacturing method described in the first exemplary embodiment.

Manufacturing steps thereafter are performed in accordance with a manufacturing method similar to the manufacturing method of the first exemplary embodiment. In this manner, a stacked structure of the semiconductor chips illustrated in FIG. 3 can be obtained.

As described above, in the semiconductor device and the method manufacturing the semiconductor device according to the present exemplary embodiment, similarly to the first exemplary embodiment, second surface film 232 which is an insulating film formed in first surface layer 213 and fourth surface film 242 which is an insulating film formed in second surface layer 223 are used as the interfaces which are directly bonded together for seal ring 250. Thus, when chemical polishing is performed on a metal such as copper (Cu) as conventionally performed, no dishing is generated in the surface of second surface film 232 and the surface of fourth surface film 242. As a result, it is possible to form seal ring 250 with no bonding defect compared to a semiconductor device that includes a metal as a seal ring in bonding interfaces.

In this manner, in the semiconductor device and the method for manufacturing the semiconductor device according to the present exemplary embodiment, seal ring 250 that has no crack and no water infiltration in an element region and has high reliability can be formed. Thus, it is possible to stably form a three-dimensional stacked semiconductor device.

In addition, as a unique effect of the manufacturing method according to the present exemplary embodiment, second surface film 232, fifth surface film 233, and first electrode 234 can be formed in first substrate 201 by a single patterning to first surface film 231. Similarly, fourth surface film 242, sixth surface film 243, and second electrode 244 can be formed in second substrate 202 by a single patterning to third surface film 241. Thus, manufacturing steps can be simplified.

Also in the present exemplary embodiment, through electrode 263 and electrode pad 262 may be disposed on a rear surface of second substrate body 221. An electrode pad may be disposed on a rear surface of first substrate body 211. In this case, a through electrode (not illustrated) may be formed on first substrate body 211. Further, electrode pads and through electrodes may be disposed on both first substrate body 211 and second substrate body 221.

In the present exemplary embodiment, although the transistors as elements are disposed in both the first substrate and the second substrate, transistors may be disposed on only one of first substrate body 211 and second substrate body 221. In the present exemplary embodiment, although each of the transistors is a planar transistor, a transistor of fin FET or another shape may be provided. Further, various types of transistors may be provided in a mixed manner.

In the present exemplary embodiment, although wiring included in the first wiring layer and wiring included in the second wiring layer each include two layers, the first wiring layer and the second wiring layer may each be a multilayer wiring layer that includes three or more wiring layers as described above. A number of layers of wiring included in the first wiring layer may differ from a number of layers of wiring included in the second wiring layer.

In the present exemplary embodiment, although a size including a shape of second surface film 232 and a size including a shape of fourth surface film 242 are the same, the size of second surface film 232 may differ from the size of fourth surface film 242. When a plurality of first electrodes 234 and a plurality of second electrodes 244 are provided, electrodes having different sizes may be provided in a mixed manner.

In the present exemplary embodiment, as described above, alignment deviation between first substrate 201 and second substrate 202 during bonding may cause direct bonding between a part of first surface film 231 and a part of fourth surface film 242 and between a part of second surface film 232 and a part of third surface film 241. However, also in such a case, the effect of the present exemplary embodiment is exhibited.

As described above, the first and second exemplary embodiments have been described as examples of the technique disclosed in the present application. The present disclosure is not limited to these exemplary embodiments and includes various forms that are conceivable without departing from the gist of the technique described in the claims. That is, various modifications, replacements, additions, and omissions can be appropriately performed within the scope of the claims or equivalents thereof. Further, the elements described in the first and second exemplary embodiments may be combined to form a new embodiment.

As described above, the exemplary embodiments have been described as examples of the technique in the present disclosure. Thus, the accompanying drawings and detailed description have been provided for explaining the example.

Therefore, in order to illustrate the technique, not only essential elements for solving the problems, but also inessential elements for solving the problems may be included in the elements shown in the accompanying drawings or in the detailed description. Therefore, such inessential elements should not be immediately determined as essential elements because of their presence in the accompanying drawings or in the detailed description.

The semiconductor device and the method for manufacturing the semiconductor device according to the present disclosure are capable of stably forming a seal ring that is continuous among a plurality of stacked semiconductor chips and, in particular, useful as a three-dimensional stacked semiconductor device bonded by direct bonding and a method for manufacturing the three-dimensional stacked semiconductor device.

What is claimed is:

1. A semiconductor device comprising:
   a first substrate having a first substrate body, and having a first element formed on a first principal surface of the first substrate body; and
   a second substrate having a second substrate body, and having a second element on a second principal surface of the second substrate body, the first substrate and the second substrate being bonded together with the first principal surface and the second principal surface facing each other, wherein:
   the first substrate includes a first surface film that is an insulating film as an uppermost layer on the first principal surface, a first electrode disposed in a first opening of the first surface film, a second surface film disposed in a second opening of the first surface film, and a first seal ring disposed under the second surface film,
   the second surface film is an insulating film made of a different material from the first surface film,
   the second substrate includes a third surface film that is an insulating film as an uppermost layer on the second principal surface, a second electrode disposed in a third opening of the third surface film, a fourth surface film disposed in a fourth opening of the third surface film, and a second seal ring disposed under the fourth surface film,
   the fourth surface film is an insulating film made of a different material from the third surface film,
   the first surface film entirely covers the first principal surface except the first electrode and the second surface film,
   the third surface film entirely covers the second principal surface except the second electrode and the fourth surface film,
   the first electrode and the second electrode are disposed facing each other and directly bonded together,
   the first surface film and the third surface film are disposed facing each other and directly bonded together,
   the second surface film and the fourth surface film are disposed facing each other and directly bonded together,
   the second surface film and the fourth surface film have a higher Young's modulus than the first surface film and the third surface film,
   a bottom surface of the second surface film is directly connected to the first seal ring,
   a bottom surface of the fourth surface film is directly connected to the second seal ring, and
   a seal ring formed of the first seal ring, the second surface film, the fourth surface film, and the second seal ring is continuous between the first substrate and the second substrate.

2. The semiconductor device according to claim 1, wherein the second surface film and the fourth surface film have higher water permeation resistance than the first surface film and the third surface film.

3. The semiconductor device according to claim 1, wherein the first seal ring and the second seal ring are made of metal material.

4. The semiconductor device according to claim 1, wherein the first seal ring and the second seal ring are made of insulating material.

5. The semiconductor device according to claim 1, wherein at least one of the second surface film and the fourth surface film is made of silicon nitride or silicon carbonitride.

6. The semiconductor device according to claim 1, wherein the first surface film and the third surface film are made of silicon oxide, and the second surface film and the fourth surface film are made of silicon nitride.

7. The semiconductor device according to claim 1, wherein at least one of the first electrode and the second electrode is made of metal material including copper, aluminum, nickel, or tungsten.

8. The semiconductor device according to claim 1, wherein:
   each opening width of the first opening and the third opening in a short-side direction is from 0.1 µm to 1 µm both inclusive, and
   each opening width of the second opening and the fourth opening in a short-side direction is from 1 µm to 10 µm both inclusive.

9. The semiconductor device according to claim 1, wherein:
   a fifth surface film made of same material as the second surface film is disposed between a side surface of the first electrode and a side surface of the first surface film, and
   a sixth surface film made of same material as the fourth surface film is disposed between a side surface of the second electrode and a side surface of the third surface film.

10. The semiconductor device according to claim 9, wherein:
    in plan view, an opening width of the first opening in a short-side direction is greater than an opening width of the second opening in a short-side direction, and
    in plan view, an opening width of the third opening in a short-side direction is greater than an opening width of the fourth opening in a short-side direction.

11. The semiconductor device according to claim 1, wherein the first electrode and the second electrode are made of different materials.

* * * * *